(12) United States Patent
Kim et al.

(10) Patent No.: US 7,807,507 B2
(45) Date of Patent: Oct. 5, 2010

(54) BACKGRINDING-UNDERFILL FILM, METHOD OF FORMING THE SAME, SEMICONDUCTOR PACKAGE USING THE BACKGRINDING-UNDERFILL FILM, AND METHOD OF FORMING THE SEMICONDUCTOR PACKAGE

(75) Inventors: Won-Keun Kim, Hwaseong-si (KR);
Myung-Kee Chung, Cheonan-si (KR);
Myung-Sung Kang, Seoul (KR)

(73) Assignee: Samsung Electronics Co., Ltd.,
Suwon-Si (KR)

( * ) Notice: Subject to any disclaimer, the term of this patent is extended or adjusted under 35 U.S.C. 154(b) by 0 days.

(21) Appl. No.: 12/476,601

(22) Filed: Jun. 2, 2009

(65) Prior Publication Data

US 2010/0047969 A1   Feb. 25, 2010

(30) Foreign Application Priority Data

Aug. 20, 2008   (KR) ...................... 10-2008-0081369

(51) Int. Cl.
*H01L 21/78* (2006.01)
(52) U.S. Cl. ................................ 438/113; 257/E21.599
(58) Field of Classification Search ......... 438/455–465, 438/106–108, 110, 113
See application file for complete search history.

(56) References Cited

U.S. PATENT DOCUMENTS

| | | | | |
|---|---|---|---|---|
| 6,589,811 B2* | 7/2003 | Sayyah | ........................ | 438/106 |
| 6,974,711 B2* | 12/2005 | Yanagisawa et al. | .......... | 438/26 |
| 7,052,934 B2* | 5/2006 | Kurimoto et al. | ............ | 438/106 |
| 7,135,385 B1* | 11/2006 | Patwardhan et al. | ......... | 438/464 |
| 7,190,058 B2* | 3/2007 | Park | ........................... | 257/678 |

FOREIGN PATENT DOCUMENTS

| | | |
|---|---|---|
| JP | 2001-332520 | 11/2001 |
| JP | 2003-174125 | 6/2003 |
| KR | 1020080002501 | 1/2008 |

* cited by examiner

*Primary Examiner*—Savitri Mulpuri
(74) *Attorney, Agent, or Firm*—F. Chau & Associates, LLC

(57) ABSTRACT

A semiconductor package forming method includes mounting a backgrinding-underfill film which includes a laminated backgrinding film and a laminated underfill film on a semiconductor wafer so that the underfill film adheres to a front side of the semiconductor wafer; backgrinding a back side of the semiconductor wafer on which the backgrinding-underfill film has been mounted and removing the backgrinding film of the backgrinding-underfill film from the semiconductor wafer. The method further includes dicing the semiconductor wafer from which the backgrinding film has been removed, so that semiconductor chips are separated from the semiconductor wafer.

19 Claims, 11 Drawing Sheets

BACKGRINDING-UNDERFILL FILM, METHOD OF FORMING THE SAME, SEMICONDUCTOR PACKAGE USING THE BACKGRINDING-UNDERFILL FILM, AND METHOD OF FORMING THE SEMICONDUCTOR PACKAGE

CROSS-REFERENCE TO RELATED APPLICATIONS

This application claims the benefit to Korean Patent Application No. 10-2008-0081369, filed on Aug. 20, 2008, the disclosure of which is hereby incorporated by reference herein in its entirety.

BACKGROUND

The present disclosure relates to a semiconductor package, a method of forming the semiconductor package, components of the semiconductor package, and to a method of forming the components of the semiconductor package.

As semiconductor products may have large capacity and be multi-functional and compact, a three-dimensional (3D) semiconductor package having a structure in which semiconductor chips are stacked are being widely used. However, as the thicknesses of semiconductor chips are decreased to minimize a semiconductor package, a semiconductor package forming process including backgrinding and semiconductor chip bonding may be difficult to perform.

SUMMARY

Exemplary embodiments of the present invention may provide a semiconductor package forming method capable of reducing the number of defective goods due to its simplicity, and a semiconductor package formed according to the semiconductor package forming method.

Exemplary embodiments of the present invention may also provide a backgrinding film that can be used in the semiconductor package forming method and the semiconductor package, and a method of forming the backgrinding film.

In accordance with an exemplary embodiment of the present invention, a method of forming a semiconductor package is provided. The method includes mounting a backgrinding-underfill film which includes a laminated backgrinding film and a laminated underfill film on a semiconductor wafer so that the underfill film adheres to a front side of the semiconductor wafer, backgrinding a back side of the semiconductor wafer on which the backgrinding-underfill film has been mounted, and removing the backgrinding film of the backgrinding-underfill film from the semiconductor wafer. The method further includes dicing the semiconductor wafer from which the backgrinding film has been removed, so that semiconductor chips are separated from the semiconductor wafer.

The backgrinding-underfill film may be formed on the semiconductor wafer by laminating.

The underfill film may include a non-conductive material. The underfill film may include an epoxy-based material or a silicone-based material. The underfill film may include an acrylic polymer material. The underfill film may include a phenol type hardening agent, an acid anhydride type hardening agent, or an amine type hardening agent. The underfill film may include a heat sensitive material, a thermoplastic material, or a UV curable material.

A material used to form the backgrinding film may include polyolefin or Polyethylene terephthalate (PET).

The backgrinding-underfill film may further include a separation film between the backgrinding film and the underfill film. The separation film may separate the backgrinding film from the underfill film by UV radiation, heating, or pressurization.

Before the backgrinding of the back side of the semiconductor wafer, the method of forming the semiconductor package may further include radiating laser for dicing to the semiconductor wafer. The laser radiation may be performed on the back side of the semiconductor wafer. Before the removing of the backgrinding film, the method of forming the semiconductor package may further include attaching a dicing tape to the backgrinded back side of the semiconductor wafer. The semiconductor wafer may be diced by extending the dicing tape.

Mechanical grinding, laser grinding, or etching may be used in the backgrinding of the back side of the semiconductor wafer.

The semiconductor wafer may include through vias to achieve vertical electrical connections between the semiconductor chips. In the backgrinding of the back side of the semiconductor wafer, the through vias may protrude from the back side of the semiconductor wafer.

Contact bumps may be formed on the front side of the semiconductor wafer to achieve electrical connection of the semiconductor chips with an external circuit.

The method of forming the semiconductor package may further include bonding the separated semiconductor chips to other semiconductor chips or an upper surface of a package substrate.

In exemplary embodiments of the present invention, a semiconductor package including a flipchip package formed according to the method of forming the semiconductor package is provided.

In exemplary embodiments of the present invention, a method of forming a backgrinding-underfill film, the method including providing an underfill film and a backgrinding film; and forming the backgrinding-underfill film by laminating the underfill film and the backgrinding film is provided.

In exemplary embodiments of the present invention, a backgrinding-underfill film formed according to the method of forming a backgrinding-underfill film is provided.

In accordance with another exemplary embodiment of the present invention, a method of forming a semiconductor package is provided. The method includes forming a plurality of through vias in a structure layer used to form semiconductor devices and in an upper surface of a semiconductor wafer, grinding the back side of the semiconductor wafer such that the through vias vertically penetrate the semiconductor wafer, removing a release film from a backgrinding-underfill film comprising a laminated underfill film and a laminated backgrinding film, mounting the backgrinding-underfill film from which the release film has been removed on a front side of the semiconductor wafer in which the through vias have been formed such that the laminated underfilm film of the backgrinding-underfill film adheres to the front side of the semiconductor wafer and the laminated backgrinding film thereof is exposed, and projecting a laser light on the semiconductor wafer on which the backgrinding-underfill film has been mounted, thereby defining modified regions for laser dicing within the semiconductor wafer.

The method further includes backgrinding a backside of the semiconductor wafer, attaching a dicing tape to the back side of the semiconductor wafer, removing the backgrinding film from the semiconductor wafer, mounting the semiconductor wafer to which the dicing tape has been attached on a jig and pushing the jig upward thereby extending the dicing tape, wherein the extended dicing tape splits the semiconductor wafer into semiconductor chips by using modified regions which are formed in the semiconductor wafer by radiation of laser light, as split starting points and by applying a force to the semiconductor wafer to which the dicing tape has been attached, dicing the semiconductor wafer so that semiconductor chips are separated from the semiconductor wafer and bonding the separated semiconductor chips to other semiconductor chips or an upper surface of a package substrate.

BRIEF DESCRIPTION OF THE DRAWINGS

Exemplary embodiments of the present invention can be understood in more detail from the following description taken in conjunction with the accompanying drawings in which.

Figure 1A:
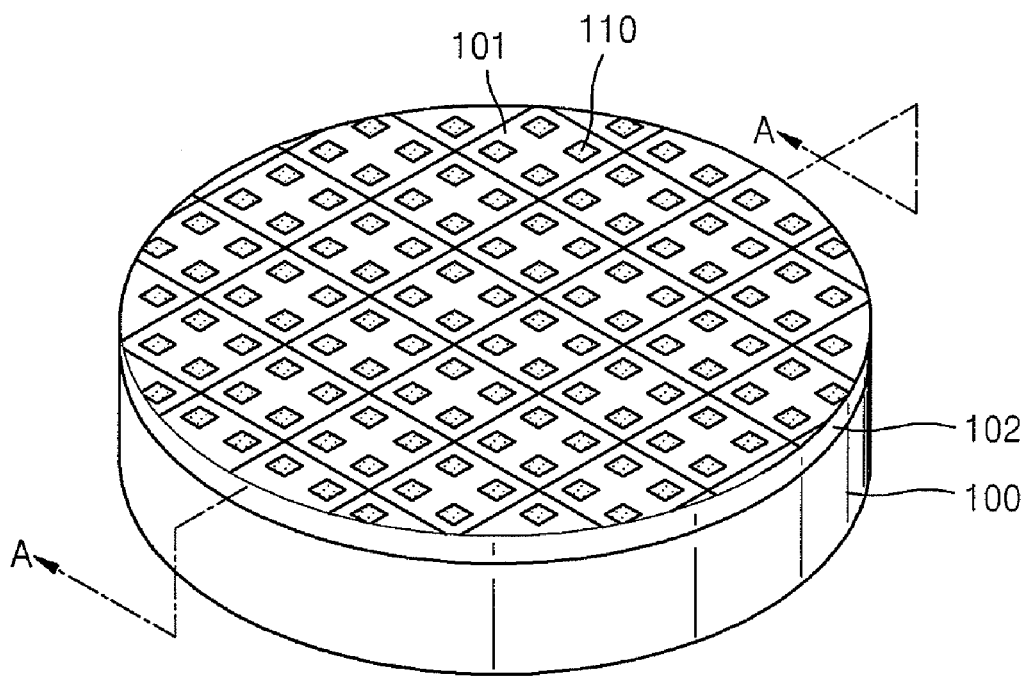
FIGS. 1A, 2A, through to 7A are perspective views illustrating a method of forming a semiconductor package, according to an exemplary embodiment of the present invention.

DETAILED DESCRIPTION OF THE
EXEMPLARY EMBODIMENTS OF THE
INVENTION

The present invention will now be described more fully with reference to the accompanying drawings, in which exemplary embodiments of the invention are shown. The invention may, however, be embodied in many different forms and should not be construed as being limited to the exemplary embodiments set forth herein. In the drawings, the thicknesses of layers and regions are exaggerated for clarity. Like reference numerals in the drawings denote like elements, and thus their description will be omitted.

Figure 1B:
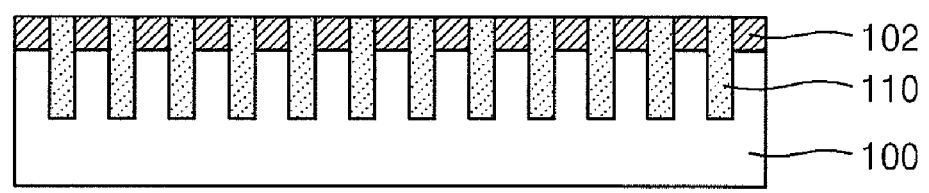
FIGS. 1B, 2B, through to 7B are cross-sections of wafers of FIGS. 1A, 2A, through to 7A which are taken along line A-A.
Figure 2A:
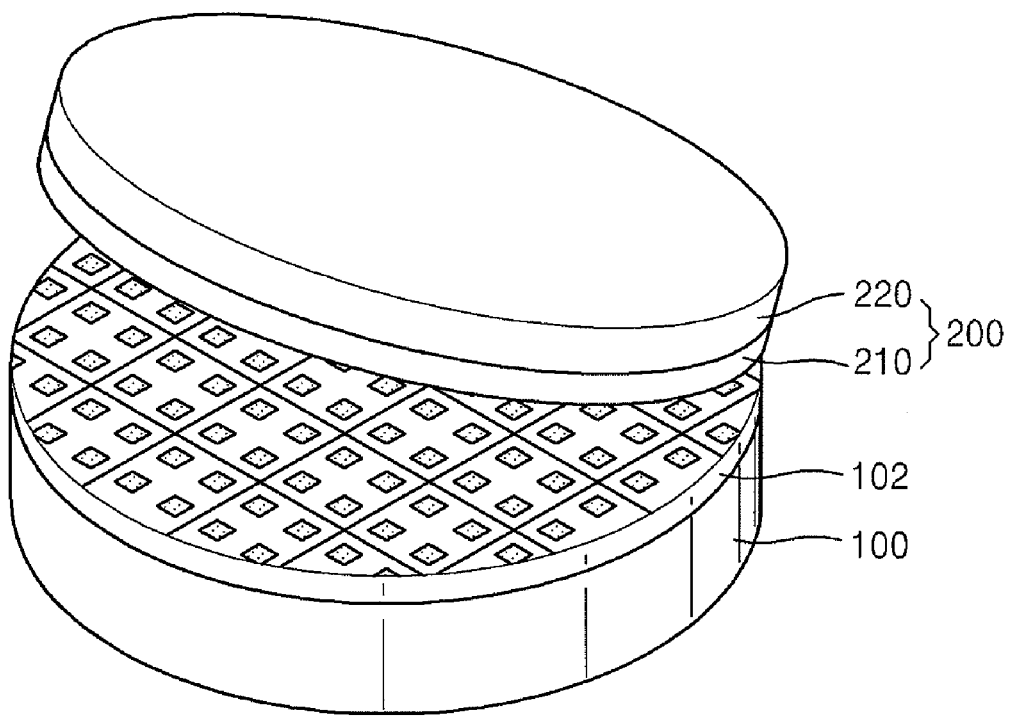
Figure 2B:
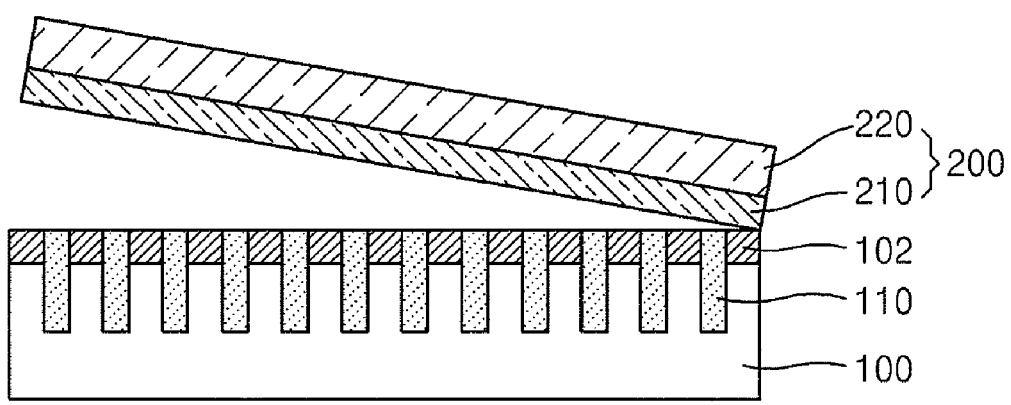

FIGS. 1A, 2A, through to 7A are perspective views illustrating a method of forming a semiconductor package, according to an exemplary embodiment of the present invention. FIGS. 1B, 2B, through to 7B are cross-sections of wafers of FIGS. 1A, 2A, through to 7A which are taken along line A-A. The line A-A is shown in only FIG. 1A.

Referring to FIGS. 1A and 1B, a semiconductor wafer 100 on which semiconductor chips 101 are formed and in which through vias 110 are formed is prepared.

The through vias 110 vertically penetrate the semiconductor chips 101 so that the semiconductor chips 101 may be physically and electrically connected to one another or the semiconductor chips 101 may be physically and electrically connected to a package substrate. The through vias 110 may be formed using the following process. Through holes are formed in the semiconductor wafer 100, insulation films are formed on inner surfaces of the through holes, and the through holes are filled with metal, thereby forming the through vias 110. The metal may be buried in the through holes by, for example, electroplating.

The through vias 110 are formed in a structure layer 102 in which structures used to form semiconductor devices have been formed, and in an upper portion of the semiconductor wafer 100. After a back side of the semiconductor wafer 100 is grinded, the through vias 110 vertically penetrate the semiconductor wafer 100. The structure layer 102 may include, for example, gate electrodes, bit lines, capacitors, wiring, etc. formed therein. Depending on the type of semiconductor device, various elements may be formed in the structure layer 102. A rewiring layer, a metal layer or contact bumps which is to contact an external circuit, and elements for protecting a package or a semiconductor device including a passivation layer may be formed in the structure layer 102.

Referring to FIGS. 2A and 2B, a backgrinding-underfill film 200 is mounted on a front side of the semiconductor wafer 100 in which the through vias 110 have been formed. The backgrinding-underfill film 200 may be mounted on the semiconductor wafer 100 by, for example, laminating. The backgrinding-underfill film 200 is mounted on the semiconductor wafer 100 so that an underfill film 210 of the backgrinding-underfill film 200 adheres to the semiconductor wafer 100 and a backgrinding film 220 thereof is exposed.

Figure 8:
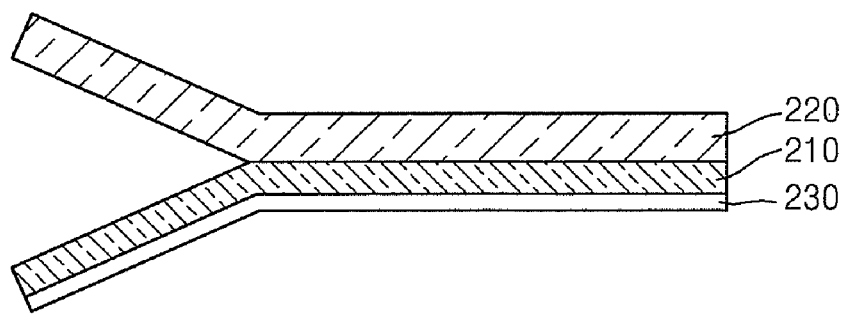
FIG. 8 is a cross-sectional view illustrating a method of forming a backgrinding-underfill film which is used in accordance with an exemplary embodiment of the present invention.

FIG. 8 illustrates formation of the backgrinding-underfill film 200. As illustrated in FIG. 8, the backgrinding-underfill film 200 may be formed by, for example, laminating the underfill film 210 and the backgrinding film 220. The underfill film 210 and the backgrinding film 220 may be individually manufactured using a general film manufacturing process.

In FIG. 8, reference numeral 230 denotes a release film which is used to facilitate handling of the backgrinding-underfill film 200 because the underfill film 210 is adhesive. When the backgrinding-underfill film 200 is mounted on the semiconductor wafer 100, the release film 230 is removed.

The underfill film 210 may serve as an adhesion film that allows the backgrinding film 220 to adhere to the semiconductor wafer 100, and may also serve as an underfill which protects stacked semiconductor chips while being disposed between the semiconductor chips or between the semiconductor chips and a package substrate. The underfill film 210 may be, for example, a nonconducting film (NCF). The underfill film 210 may be formed of, for example, an epoxy-based or silicone-based material. The underfill film 210 may include, for example, a phenol type, acid anhydride type, or amine type hardening agent. The underfill film 210 may include, for example, a heat sensitive material, a thermoplastic material, or a ultra-violet (UV) curable material that include acrylic polymer.

In accordance with a thickness of an underfill required by a semiconductor package, the thickness of the underfill film 210 may be adjusted. For example, the thickness of the underfill film 210 may be adjusted so that upper surfaces of contact bumps of the semiconductor chips are exposed or the contact bumps of the semiconductor chips are covered.

In embodiments of the present invention, a laminated film may be used as an underfill, and thus if a liquid type underfill is used, required processes such as, for example, coating, printing, B-stage (i.e., hardening), etc. may be omitted. Thus, an underfill process may be simplified, and the liquid type underfill may be readily applied to thin wafers.

A separation film may be formed on an interface between the underfill film 210 and the backgrinding film 220. The separation film may be implemented as, for example, a UV curable film, a pressure sensitive layer, or a heat sensitive layer to facilitate detachment of the backgrinding film 220 which occurs later. The UV curable film is a material whose adhesiveness decreases when UV is radiated, the pressure sensitive layer is a material whose adhesiveness decreases when pressure is applied, and the heat sensitive layer is a material whose adhesiveness decreases when heat is applied. Thus, these film or layers may facilitate the removal of the backgrinding film 220 formed thereon due to UV radiation or application of pressure or heat.

Figure 3A:
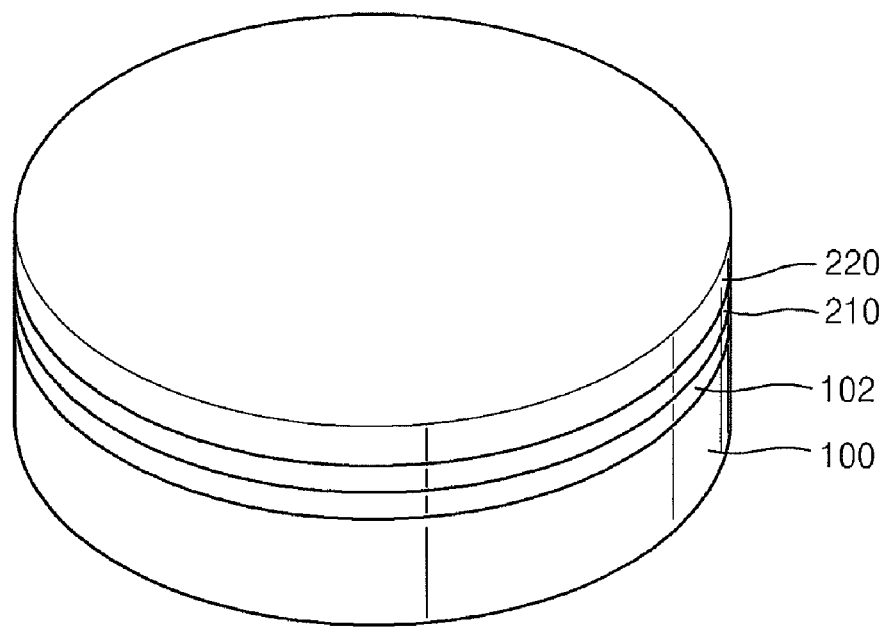
Figure 3B:
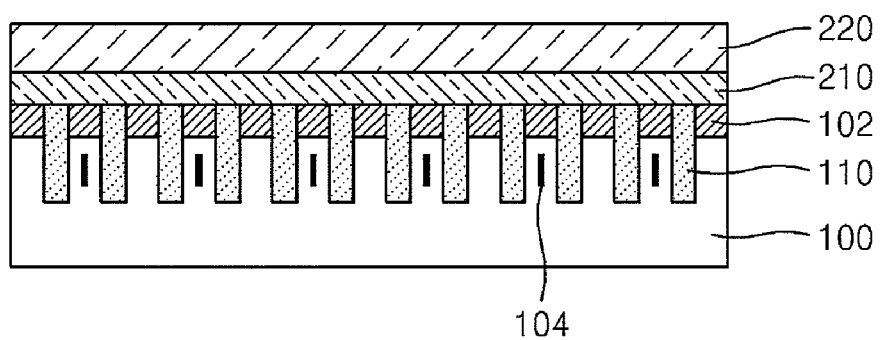

Referring to FIGS. 3A and 3B, laser light is projected to the semiconductor wafer 100 on which the backgrinding-underfill film 200 has been mounted, thereby defining modified regions 104 for laser dicing within the semiconductor wafer 100. The laser light may be projected onto the back side of the semiconductor wafer 100. The modified regions 104 are obtained from a material of the semiconductor wafer 100 that melts by the laser light, and may serve as a splitting start point which is used during semiconductor chip splitting which occurs later.

Figure 4A:
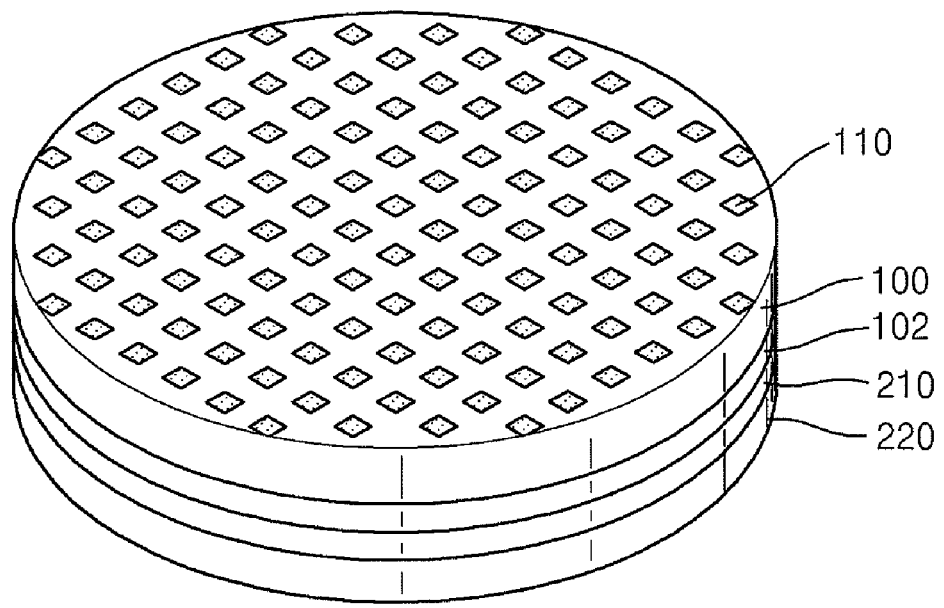
Figure 4B:
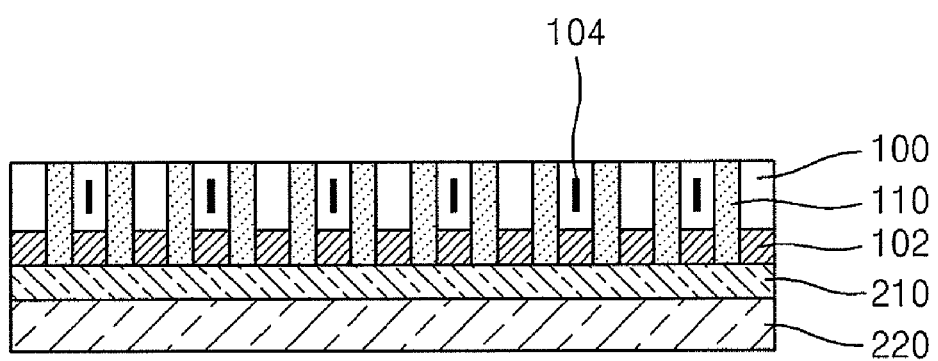

Referring to FIGS. 4A and 4B, the back side of the semiconductor wafer 100 on which the backgrinding-underfill film 200 has been formed is backgrinded. During the backgrinding, the backgrinding film 220 protects the front side of the semiconductor wafer 100 on which semiconductor devices have been formed. The backgrinding may be, for example, laser grinding, etching, or mechanical grinding. The backgrinding may be performed, for example, in two operations: one is backgrinding the back side of the semiconductor wafer 100 to an extent that the through vias 110 are not exposed; and the other is performing wet etching or dry etching so that the through vias 110 are exposed through the back side of the semiconductor wafer 100. At this time, the through vias 110 may protrude from the back side of the semiconductor wafer 100. The protruding through vias 10 may form contact bumps. Alternatively, a rewiring layer may be formed on the through vias 110 exposed on the back side of the semiconductor wafer 100, a bonding pad may be formed on the rewiring layer, and special contact bumps may be formed on the bonding pad. The backgrinded semiconductor wafer 100 turns into a thin wafer.

Figure 5A:
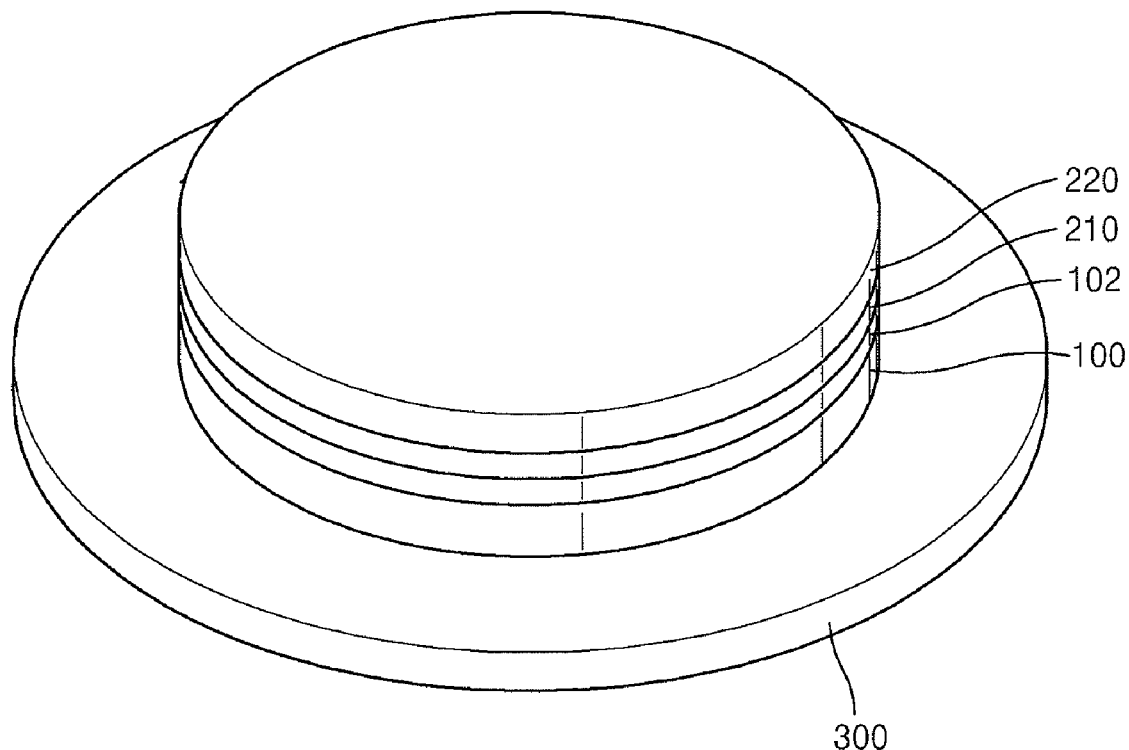
Figure 5B:
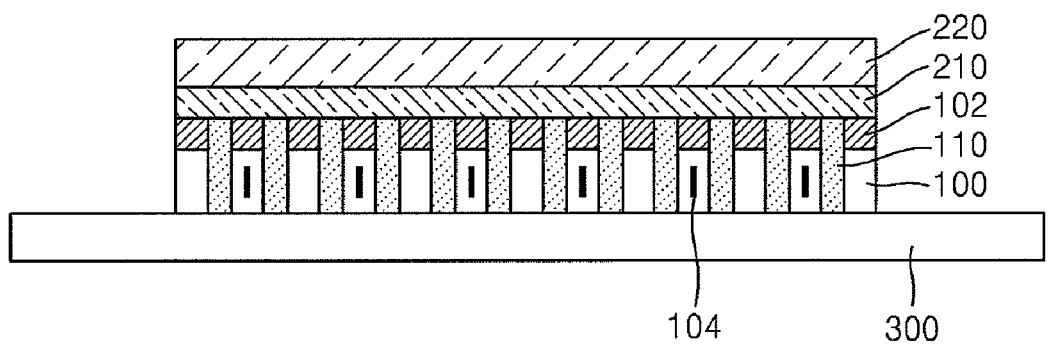

Referring to FIGS. 5A and 5B, a dicing tape 300 is attached to the back side of the semiconductor wafer 100. The dicing tape 300 may be formed of for example, flexible plastics. The dicing tape 300 may be attached to the semiconductor wafer 100 by using, for example, an adhesion layer whose adhesiveness decreases due to UV radiation.

Figure 6A:
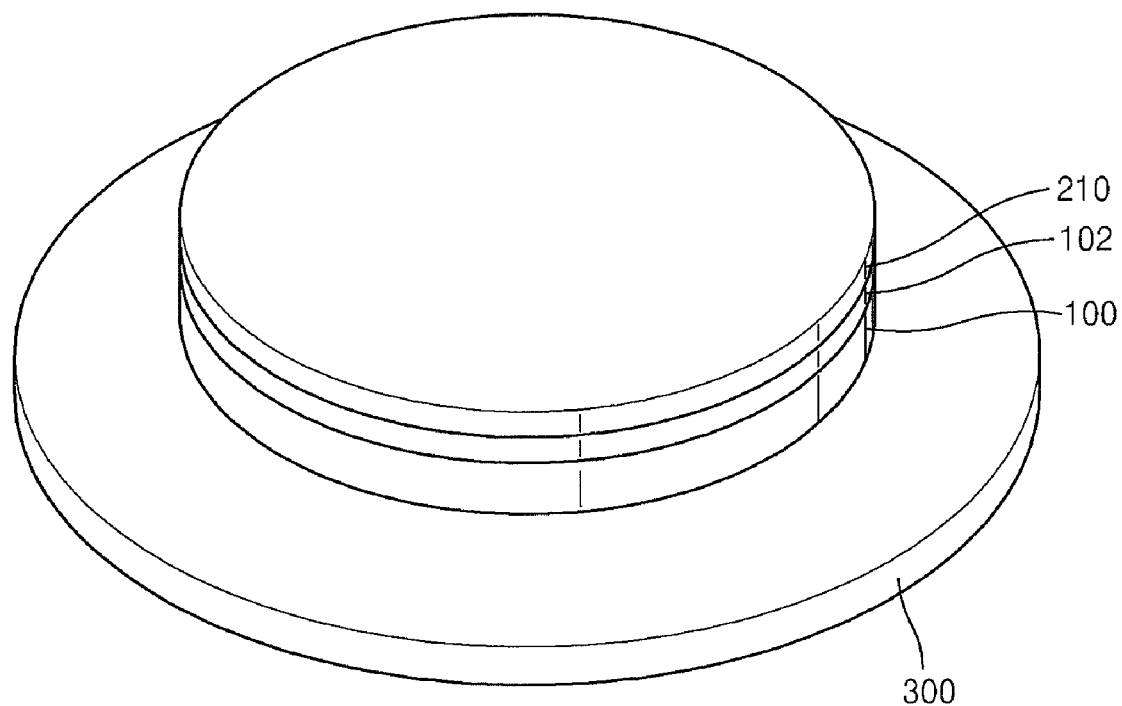
Figure 6B:
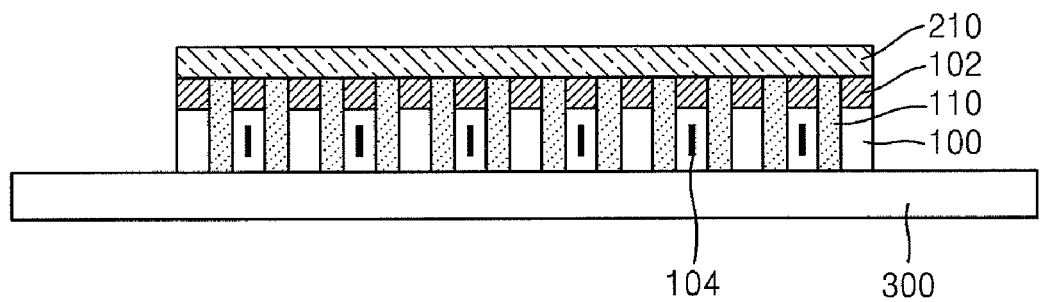

Referring to FIGS. 6A and 6B, the backgrinding film 220 is removed from the semiconductor wafer 100. As described above, if a UV curable film is formed between the backgrinding film 220 and the underfill film 210, the adhesion of the UV curable film may be reduced by UV radiation, and thus the backgrinding film 220 is removed. If a pressure sensitive layer or a heat sensitive layer is formed between the backgrinding film 220 and the underfill film 210, the adhesion of the pressure sensitive layer or heat sensitive layer may be reduced by pressure or heat application, and thus the backgrinding film 220 is removed. The underfill film 210 remains on the front side of the semiconductor wafer 100 from which the backgrinding film 220 has been removed.

Figure 7A:
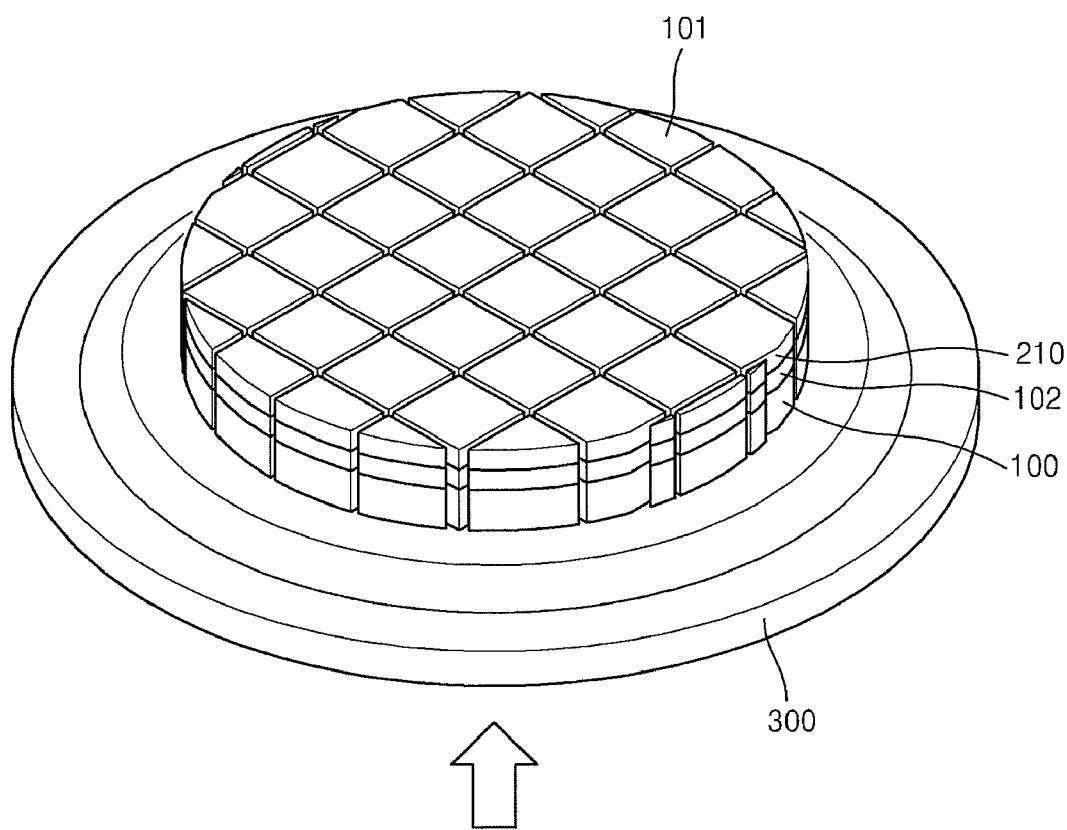
Figure 7B:
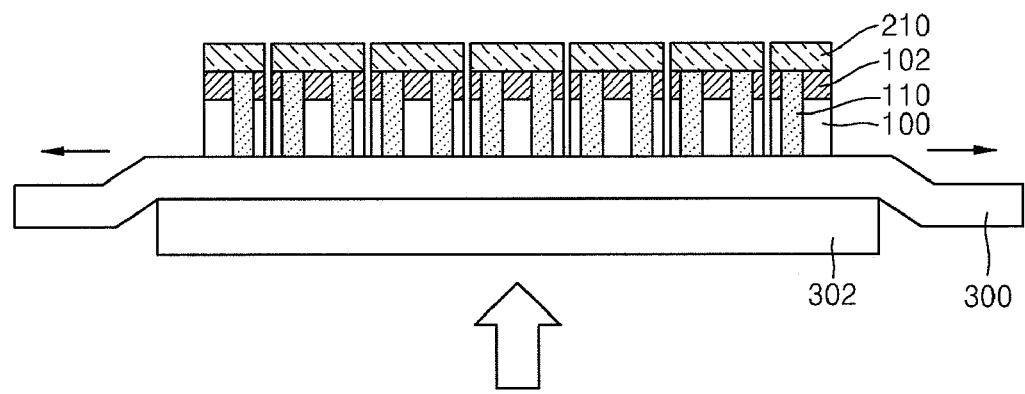

Referring to FIGS. 7A and 7B, the semiconductor wafer 100 to which the dicing tape 300 has been attached is mounted on a jig 302, and the jig 302 is pushed upward, thereby extending the dicing tape 300. The extended dicing tape 300 splits the semiconductor wafer 100 into the semiconductor chips 101 by using the modified regions 104, which are formed in the semiconductor wafer 100 by radiation of laser light, as splitting start points and by applying a force to the semiconductor wafer 100 to which the dicing tape 300 has been attached. At this time, the underfill film 210 on the semiconductor wafer 100 is also diced, together with the semiconductor chips 101.

A 3D semiconductor package in which semiconductor chips are vertically coupled together to be stacked by using through vias may be reduced in size and in connecting paths, thereby increasing the speed of the 3D semiconductor package. To form the through vias, a thin wafer may be used. The thin wafer may be formed by polishing a wafer to have a significantly small thickness, for example, no more than 100 μm, more preferably, no more than 50 μm, in a wafer backgrinding process.

If a conventional underfill process is used in a process of forming a 3D package of semiconductor chips having through vias from a thin wafer, a wafer backgrinding process is performed using, for example, a glass wafer support system (GWSS), and then the thin wafer is diced after a glass wafer is removed. When the semiconductor chips are stacked, an underfill process is performed, in which a liquid underfill such as, for example, epoxy is injected into between the stacks of semiconductor chips or between the semiconductor chips and a package substrate and then hardened. In this conventional packaging process, as the GWSS is used, dicing and backgrinding are performed in different equipment. Thus, it may be difficult to manufacture the equipment. Due to the use of a special underfill process, the liquid underfill may need to undergo processes, such as, for example, coating, printing, hardening, etc. Consequently, the conventional packaging process may be complicated and may be difficult to be applied to thin wafers. Furthermore, an adhesive used in adhesion of the glass wafer remains between contact bumps, which thereby may result in contact failures.

On the other hand, in the current exemplary embodiment of the present invention, the use of the GWSS may not be necessary because of the use of the backgrinding-underfill film 200. Thus, processes ranging from laser dicing to dicing tape mounting may be performed in a single piece of equipment, and thus the back grinding process may be simplified and line manufacturing equipment may be simplified. As the underfill film 210 may still remain on the semiconductor wafer 100 after the backgrinding film 220 is removed, an adhesive may be prevented from remaining between the contact bumps of the semiconductor chips 101 when a glass wafer is removed. In addition, due to the use of the underfill film 210 as an underfill, the underfill film 210 may not need to undergo many processes, such as, for example, coating, printing, hardening, etc., and thus an underfill process may be simplified and application of thin wafers may be relatively easy. Furthermore, due to the use of the underfill film 210 as an underfill, a final underfill with a desired thickness may be obtained by adjusting the thickness of the underfill film 210.

FIGS. 9A through 9E are cross-sectional views illustrating a method of forming a semiconductor package, according to another exemplary embodiment of the present invention. A redundant portion of the present exemplary embodiment as compared with the embodiment described with reference to FIGS. 1A through 7A and FIGS. 1B through 7B will now be briefly described.

Figure 9A:
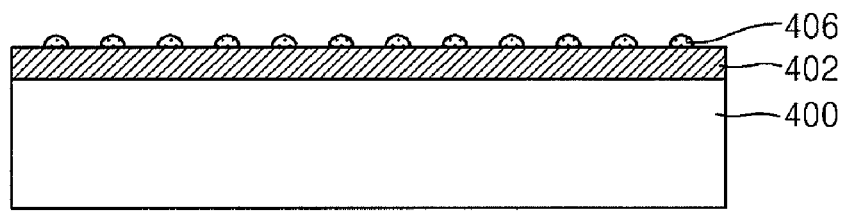
FIGS. 9A through 9E are cross-sectional views illustrating a method of forming a semiconductor package, according to an exemplary embodiment of the present invention.

Referring to FIG. 9A, a semiconductor wafer 400 on which a structure layer 402 in which semiconductor devices are formed includes a ball grid array (BGA) 406 formed thereon is prepared. The structure layer 402 is a layer in which structures used to form semiconductor devices are formed. As described above, a rewiring layer, a metal layer or contact bumps which is to contact with an external circuit, and elements for protecting a package or a semiconductor device including a passivation layer, may be formed in the structure layer 402.

Figure 9B:
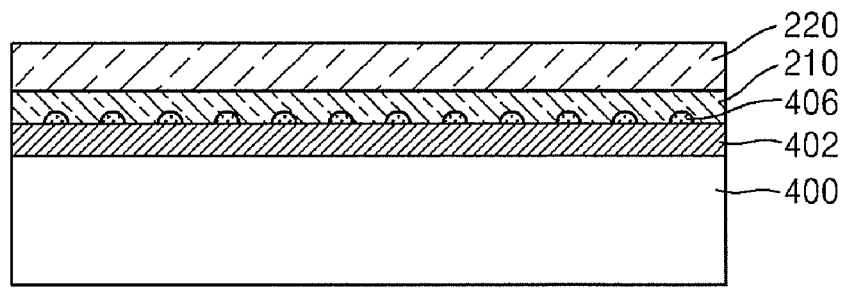

Referring to FIG. 9B, the backgrinding-underfill film 200 is mounted on a front side of the semiconductor wafer 400 on which the BGA 406 has been formed. The backgrinding-underfill film 200 is obtained by, for example, laminating the underfill film 210 and the backgrinding film 220, as described above with reference to FIGS. 2A, 2B, and 8.

Figure 9C:
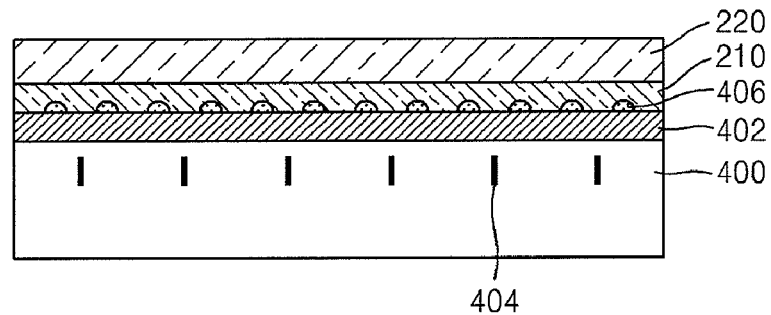

Referring to FIG. 9C, modified regions 404 for laser dicing are formed in the semiconductor wafer 400 on which the backgrinding-underfill film 200 has been mounted by, for example, radiating laser light onto the semiconductor wafer 400.

Figure 9D:
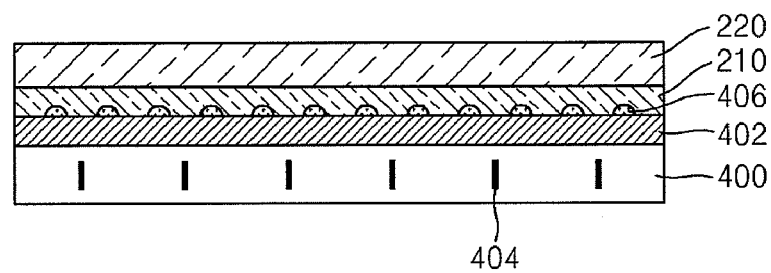

Referring to FIG. 9D, a back side of the semiconductor wafer 400 on which the backgrinding-underfill film 200 has been mounted is back-grinded. The backgrinding may be performed by, for example, mechanical grinding, laser grinding, etching, or a mixture of two or more of these processes.

Figure 9E:
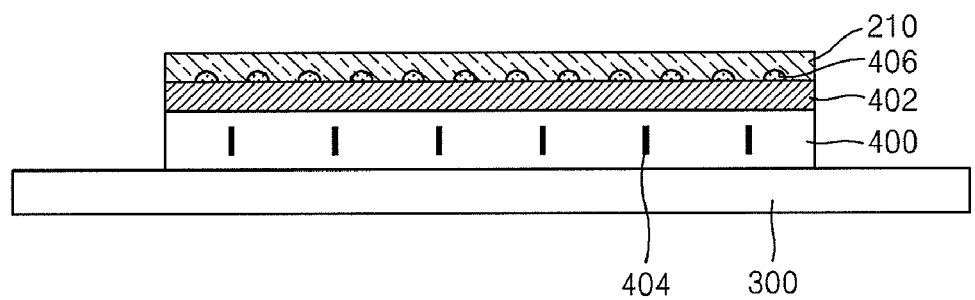

Referring to FIG. 9E, the dicing tape 300 is attached to the back side of the backgrinded semiconductor wafer 400, and the backgrinding film 220 is removed from the semiconductor wafer 400. For example, as described above, the dicing tape 300 may be formed of flexible plastics and be attached to the semiconductor wafer 400 by using an adhesion layer whose adhesiveness decreases due to UV radiation. The removal of the backgrinding film 220 is as described above with reference to FIGS. 6A and 6B. The underfill film 210 remains on the front side of the semiconductor wafer 400 from which the backgrinding film 220 has been removed.

Figure 9F:
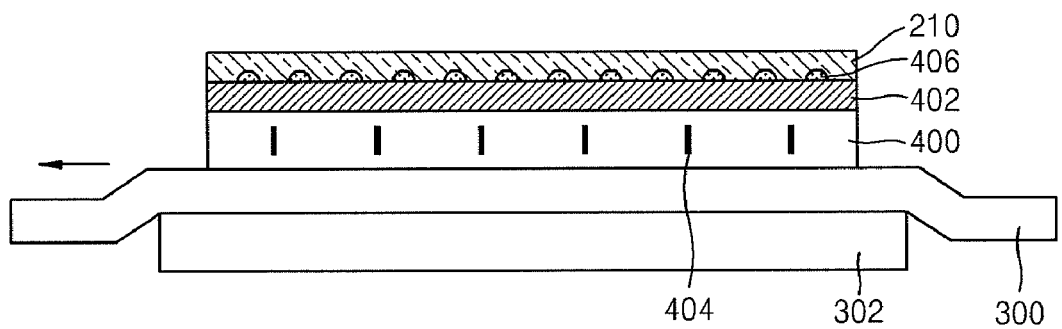

Referring to FIG. 9F, the dicing tape 300 attached to the semiconductor wafer 400 is extended by pushing upward the jig 302 on which the semiconductor wafer 400 is mounted, thereby splitting the semiconductor wafer 400 into the semiconductor chips 401. At this time, the underfill film 210 on the semiconductor wafer 400 is also diced, together with the semiconductor chips 401.

In the current exemplary embodiment, similar to the previous exemplary embodiment, a film which is a combination of a backgrinding film and an underfill film is used, resulting in a simplified process and simplified equipment. In addition, the underfill film functions as an adhesive of the backgrinding film, and later serves as an underfill after being hardened. Thus, the underfill film does not need to be removed, whereby contact failures may be prevented from occurring by an adhesive left between BGA bumps and the thickness of an underfill may be controlled.

Although a case where laser dicing is performed has been illustrated in the above-described exemplary embodiments, the present invention is not be limited to this illustration, and dicing other than the laser dicing may be performed. In addition, although a package having through vias and a BGA package have been illustrated in the above-described exemplary embodiments, the present invention may be applied to various types of packages, such as, for example, flip-chip packages, wafer level packages, chip scale packages, semiconductor chip stacks, and wafer stacks.

Figure 10A:
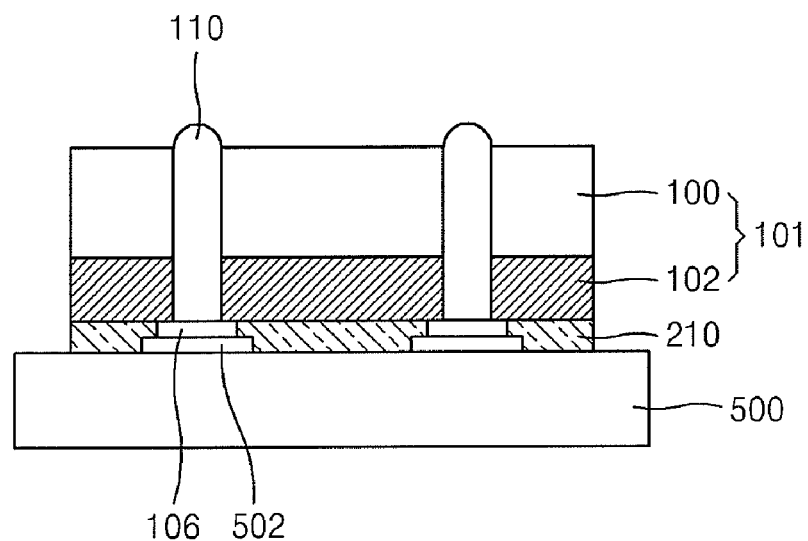
FIGS. 10A and 10B are schematic cross-sectional views illustrating a semiconductor package according to an exemplary embodiment of the present invention.

FIG. 10A is a schematic cross-sectional view illustrating a single semiconductor package in which a semiconductor chip 101 formed according to the exemplary embodiment illustrated in FIGS. 1A through 7A and FIGS. 1B through 7B is mounted on a package substrate 500. Referring to FIG. 10A, the semiconductor chip 101 is flip-chip bonded to the package substrate 500 so that a front side of the semiconductor chip 101 may face the package substrate 500. A bonding metal layer 106 of the semiconductor chip 101 is connected to a contact pad 502 of the package substrate 500, and thus the semiconductor chip 101 is electrically connected to the package substrate 500. The bonding metal layer 106 of the semiconductor chip 101 may be connected to a through via 110. The underfill film 210 interposed between the semiconductor chip 101 and the package substrate 500 is hardened and then strengthens the bonding of the semiconductor chip 101 with the package substrate 500. Thus, the electrical and mechanical reliability of the semiconductor package may improve.

Figure 10B:
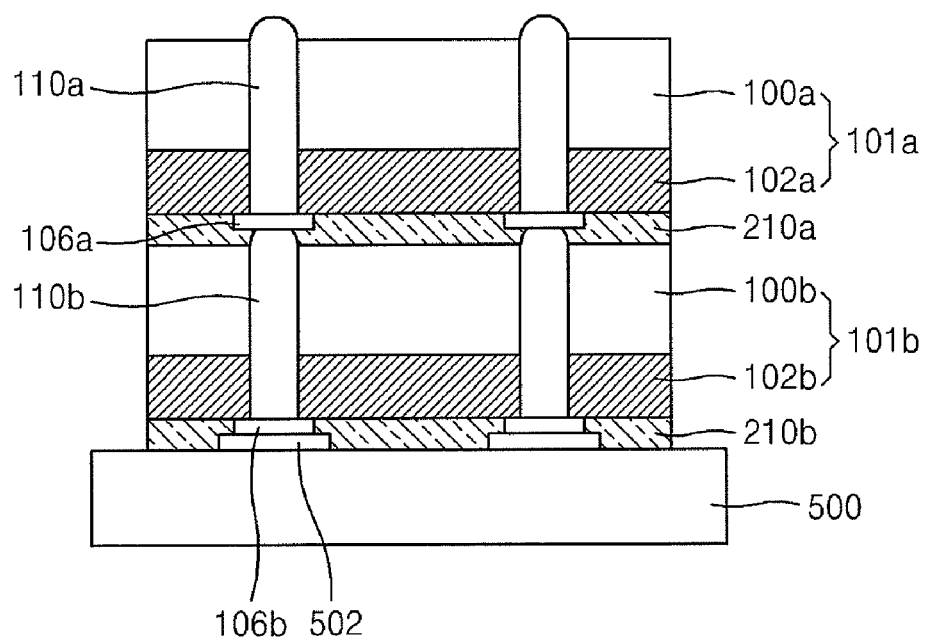

FIG. 10B is a schematic cross-sectional view illustrating a 3D semiconductor package in which upper and lower semiconductor chips 101a and 101b formed according to the embodiment illustrated in FIGS. 1A through 7A and FIGS. 1B through 7B are stacked on the package substrate 500. A relationship between the lower semiconductor chips 101b and the package substrate 500 is as described above with reference to FIG. 10A. A bonding metal layer 106a on a front side of the upper semiconductor chip 101a contacts a contact bump 110b, which is formed from a protruded portion of a through via 110b, on a back side of the lower semiconductor chips 101b. An underfill film 210a interposed between the upper and lower semiconductor chips 101a and 101b is hardened and then strengthens the bonding of the upper and lower semiconductor chips 101a and 101b. Thus, the electrical and mechanical reliability of the 3D semiconductor package may improve. The bonding metal layers 106a and 106b of the upper and lower semiconductor chips 101a and 101b are connected to through vias 110a and 110b, and thus the upper and lower semiconductor chips 101a and 101b are vertically connected to the package substrate 500 via the through vias 110a and 110b. The through via 110b of the lower semiconductor chip 101b protrudes from the back side of the semiconductor chip 101b to form the contact bump 110b. In this way, one or more semiconductor chips may be further stacked on the upper semiconductor chip 101a of FIG. 10B.

Figure 11A:
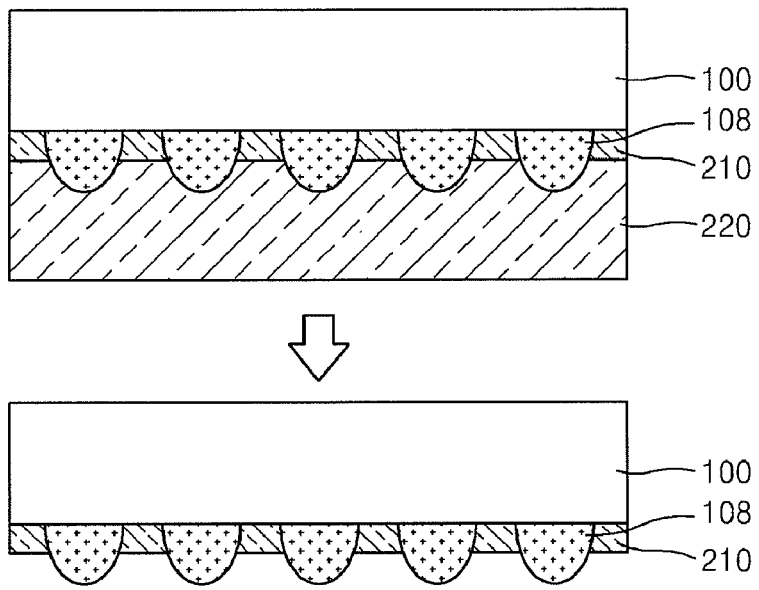
FIGS. 11A and 11B are cross-sectional views illustrating a feature that a degree to which contact bumps are exposed outside an underfill film of a backgrinding-underfill film can be controlled by adjusting the thickness of the underfill film.
Figure 11B:
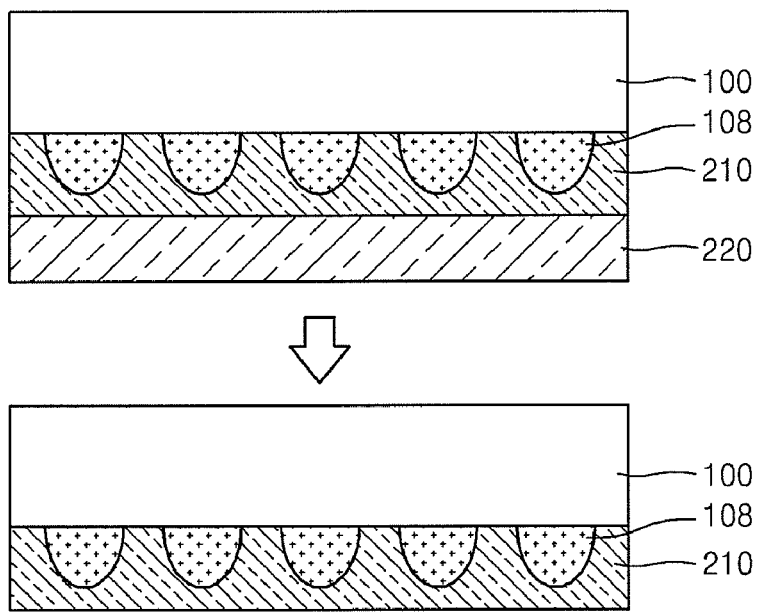

FIGS. 11A and 11B show that a degree to which contact bumps 108 are exposed outside the underfill film 210 after removal of the backgrinding film 220 of the backgrinding-underfill film 200 may be controlled by adjusting the thickness of the underfill film 210 of the backgrinding-underfill film 200.

FIG. 11A illustrates a case where the underfill film 210 is thinly formed to expose upper surfaces of the contact bumps 108. FIG. 11b illustrates a case where the underfill film 210 is thickly formed to cover the upper surfaces of the contact bumps 108. Although the underfill film 210 fully fills spaces between the semiconductor chips 101 and a package substrate or between the semiconductor chips 101 in the embodiments illustrated in FIGS. 1A through 7B, FIGS. 9A through 9F, and FIGS. 10A and 10B, the degree of exposure of the contact bumps 108 may be controlled by, for example, adjusting the thickness of the underfill film 210 of the backgrinding-underfill film 200 as illustrated in FIG. 11A. The contact bumps 108 of FIGS. 11A and 11B may be replaced by, for example, an element which contacts other semiconductor chips or a package substrate, including a bonding metal layer.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a semiconductor package, the method comprising:
mounting a backgrinding-underfill film which includes a laminated backgrinding film and a laminated underfill film on a semiconductor wafer so that the underfill film adheres to a front side of the semiconductor wafer;

backgrinding a back side of the semiconductor wafer on which the backgrinding-underfill film has been mounted;

removing the backgrinding film of the backgrinding-underfill film from the semiconductor wafer, wherein the underfill film remains on the semiconductor wafer from which the backgrinding film has been removed; and dicing the semiconductor wafer from which the backgrinding film has been removed and the underfill film remains, so that semiconductor chips are separated from the semiconductor wafer, and wherein the semiconductor wafer comprises through vias to achieve vertical electrical connections between the semiconductor chips.

2. The method of claim 1, wherein the backgrinding-underfill film is formed on the semiconductor wafer by laminating.

3. The method of claim 1, wherein the underfill film comprises a non-conductive material.

4. The method of claim 1, wherein the underfill film comprises one of an epoxy-based material and a silicone-based material.

5. The method of claim 1, wherein the underfill film comprises an acrylic polymer material.

6. The method of claim 1, wherein the underfill film comprises one of a phenol type hardening agent, an acid anhydride type hardening agent, and an amine type hardening agent.

7. The method of claim 1, wherein the underfill film comprises one of a heat sensitive material, a thermoplastic material, and an ultra-violet (UV) curable material.

8. The method of claim 1, wherein a material used to form the backgrinding film comprises one of polyolefin and Polyethylene terephthalate (PET).

9. The method of claim 1, wherein the backgrinding-underfill film further comprises a separation film between the backgrinding film and the underfill film.

10. The method of claim 9, wherein the separation film separates the backgrinding film from the underfill film by using a method selected from UV radiation, heating, and pressurization.

11. The method of claim 1, wherein before the backgrinding of the back side of the semiconductor wafer, further comprising using a radiating laser for dicing to the semiconductor wafer.

12. The method of claim 11, wherein the laser radiation is performed on the back side of the semiconductor wafer.

13. The method of claim 11, wherein before the removing of the backgrinding film, further comprising attaching a dicing tape to the backgrinded back side of the semiconductor wafer, wherein the dicing of the semiconductor wafer comprises extending the dicing tape.

14. The method of claim 1, wherein one of mechanical grinding, laser grinding, and etching is used in the backgrinding of the back side of the semiconductor wafer.

15. The method of claim 1, wherein in the backgrinding of the back side of the semiconductor wafer, the through vias protrude from the back side of the semiconductor wafer.

16. The method of claim 1, wherein one of a bonding metal layer and contact bumps is formed on the front side of the semiconductor wafer to achieve electrical connection of the semiconductor chips with an external circuit.

17. The method of claim 1, further comprising bonding the separated semiconductor chips to other semiconductor chips or an upper surface of a package substrate.

18. The method of claim 17, wherein the bonding between the semiconductor chips or between the semiconductor chips and the package substrate is strengthened and protected by hardening the underfill film.

19. A method of forming a semiconductor package, the method comprising:

forming a plurality of through vias in a structure layer used to form semiconductor devices and in an upper surface of a semiconductor wafer;

grinding the back side of the semiconductor wafer such that the through vias vertically penetrate the semiconductor wafer;

removing a release film from a backgrinding-underfill film comprising a laminated underfill film and a laminated backgrinding film;

mounting the backgrinding-underfill film from which the release film has been removed on a front side of the semiconductor wafer in which the through vias have been formed such that the laminated underfilm film of the backgrinding-underfill film adheres to the front side of the semiconductor wafer and the laminated backgrinding film thereof is exposed;

projecting a laser light on the semiconductor wafer on which the backgrinding-underfill film has been mounted, thereby defining modified regions for laser dicing within the semiconductor wafer;

backgrinding a back side of the semiconductor wafer;

attaching a dicing tape to the back side of the semiconductor wafer;

removing the backgrinding film from the semiconductor wafer;

mounting the semiconductor wafer to which the dicing tape has been attached on a jig and pushing the jig upward thereby extending the dicing tape, wherein the extended dicing tape splits the semiconductor wafer into semiconductor chips by using the modified regions formed in the semiconductor wafer by the radiation of laser light as split starting points and by applying a force to the semiconductor wafer to which the dicing tape has been attached;

dicing the semiconductor wafer so that semiconductor chips are separated from the semiconductor wafer; and bonding the separated semiconductor chips to other semiconductor chips or an upper surface of a package substrate.

* * * * *